(12) United States Patent
Birner et al.

(10) Patent No.: US 10,410,956 B2
(45) Date of Patent: Sep. 10, 2019

(54) LDMOS TRANSISTOR AND METHOD

(71) Applicant: Infineon Technologies AG, Neubiberg (DE)

(72) Inventors: Albert Birner, Regensburg (DE); Helmut Brech, Lappersdorf (DE); Matthias Zigldrum, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/192,283

(22) Filed: Jun. 24, 2016

(65) Prior Publication Data

US 2017/0372986 A1    Dec. 28, 2017

(51) Int. Cl.

| | |
|---|---|
| *H01L 23/48* | (2006.01) |
| *H01L 23/532* | (2006.01) |
| *H01L 29/78* | (2006.01) |
| *H01L 29/417* | (2006.01) |
| *H01L 29/40* | (2006.01) |
| *H01L 29/06* | (2006.01) |
| *H01L 29/10* | (2006.01) |
| *H01L 21/288* | (2006.01) |

(Continued)

(52) U.S. Cl.
CPC ........ *H01L 23/481* (2013.01); *H01L 21/2885* (2013.01); *H01L 21/7682* (2013.01); *H01L 21/76834* (2013.01); *H01L 21/76841* (2013.01); *H01L 21/76898* (2013.01); *H01L 23/528* (2013.01); *H01L 23/53228* (2013.01); *H01L 23/53295* (2013.01); *H01L 29/4175* (2013.01); *H01L 29/7816* (2013.01); *H01L 29/7835* (2013.01); *H01L 21/76846* (2013.01); *H01L 23/53238* (2013.01); *H01L 23/53266* (2013.01); *H01L 29/063* (2013.01); *H01L 29/0696* (2013.01); *H01L 29/1045* (2013.01); *H01L 29/404* (2013.01)

(58) Field of Classification Search
None
See application file for complete search history.

(56) References Cited

U.S. PATENT DOCUMENTS

| | | | |
|---|---|---|---|
| 5,252,848 | A | 10/1993 | Adler et al. |
| 6,048,772 | A | 4/2000 | D'Anna |
| 7,119,399 | B2 | 10/2006 | Ma et al. |

(Continued)

FOREIGN PATENT DOCUMENTS

DE          10348641 A1     5/2005

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Jay C Chang
(74) *Attorney, Agent, or Firm* — Murphy, Bilak & Homiller, PLLC

(57) ABSTRACT

In an embodiment, a semiconductor device includes a semiconductor substrate, a LDMOS transistor arranged in a front surface of the semiconductor substrate and a conductive through substrate via. The conductive through substrate via includes a via extending from the front surface to a rear surface of the semiconductor substrate, a conductive plug filling a first portion of the via and a conductive liner layer lining side walls of a second portion of the via and electrically coupled to the conductive plug.

21 Claims, 12 Drawing Sheets

(51) Int. Cl.
*H01L 21/768* (2006.01)
*H01L 23/528* (2006.01)

(56) References Cited

U.S. PATENT DOCUMENTS

| | | | |
|---|---|---|---|
| 7,221,034 B2 | 5/2007 | Ma et al. | |
| 7,253,492 B2 | 8/2007 | Ma et al. | |
| 7,456,094 B2 | 11/2008 | Ma et al. | |
| 7,626,233 B2 | 12/2009 | Tornblad et al. | |
| 7,772,123 B2 | 8/2010 | Birner et al. | |
| 8,227,340 B2 | 7/2012 | Seidel et al. | |
| 8,399,936 B2 | 3/2013 | Birner et al. | |
| 8,518,764 B2 | 8/2013 | Dao et al. | |
| 8,680,615 B2 | 3/2014 | Mitra et al. | |
| 8,716,791 B1 | 5/2014 | Iravani et al. | |
| 8,890,324 B2 | 11/2014 | Dao | |
| 9,064,712 B2 | 6/2015 | Sanders et al. | |
| 9,165,918 B1 | 10/2015 | Yang et al. | |
| 9,245,952 B2 | 1/2016 | Yao et al. | |
| 2002/0038891 A1 | 4/2002 | Ryu et al. | |
| 2004/0067632 A1 | 4/2004 | Andoh et al. | |
| 2004/0229456 A1* | 11/2004 | Andricacos | C25D 3/38 |
| | | | 438/642 |
| 2006/0046350 A1 | 3/2006 | Jiang et al. | |
| 2006/0183317 A1 | 8/2006 | Noguchi et al. | |
| 2006/0289924 A1* | 12/2006 | Wang | H01L 29/792 |
| | | | 257/315 |
| 2008/0093641 A1 | 4/2008 | Ludikhuize et al. | |
| 2008/0119007 A1* | 5/2008 | Raghuram | H01L 27/2409 |
| | | | 438/99 |
| 2008/0166849 A1 | 7/2008 | Yang et al. | |
| 2009/0026539 A1 | 1/2009 | Birner et al. | |
| 2009/0294849 A1 | 12/2009 | Min et al. | |
| 2009/0302480 A1 | 12/2009 | Birner et al. | |
| 2010/0022084 A1 | 1/2010 | Chen et al. | |
| 2010/0032756 A1 | 2/2010 | Pendharkar et al. | |
| 2010/0230818 A1* | 9/2010 | Birner | H01L 21/76898 |
| | | | 257/751 |
| 2010/0295154 A1 | 11/2010 | Riess | |
| 2011/0024839 A1 | 2/2011 | Zinn et al. | |
| 2011/0074040 A1 | 3/2011 | Frank et al. | |
| 2011/0101425 A1 | 5/2011 | Grote et al. | |
| 2011/0309442 A1 | 12/2011 | Grote et al. | |
| 2012/0037969 A1* | 2/2012 | Sanders | H01L 23/481 |
| | | | 257/296 |
| 2012/0061758 A1 | 3/2012 | Khan et al. | |
| 2012/0061798 A1 | 3/2012 | Wong et al. | |
| 2012/0273840 A1 | 11/2012 | Luo et al. | |
| 2013/0119547 A1 | 5/2013 | Kim et al. | |
| 2013/0207183 A1 | 8/2013 | Kao | |
| 2014/0225186 A1 | 8/2014 | Abou-Khalil et al. | |
| 2014/0264896 A1 | 9/2014 | Lu et al. | |
| 2015/0097238 A1 | 4/2015 | Zhang et al. | |
| 2015/0243583 A1 | 8/2015 | Li et al. | |
| 2015/0251382 A1* | 9/2015 | Terasaki | B23K 20/02 |
| | | | 428/640 |
| 2015/0294898 A1 | 10/2015 | Yamaguchi | |
| 2016/0141362 A1 | 5/2016 | Gogoi | |
| 2016/0141369 A1 | 5/2016 | Kim et al. | |
| 2016/0307823 A1 | 10/2016 | Fang et al. | |

\* cited by examiner

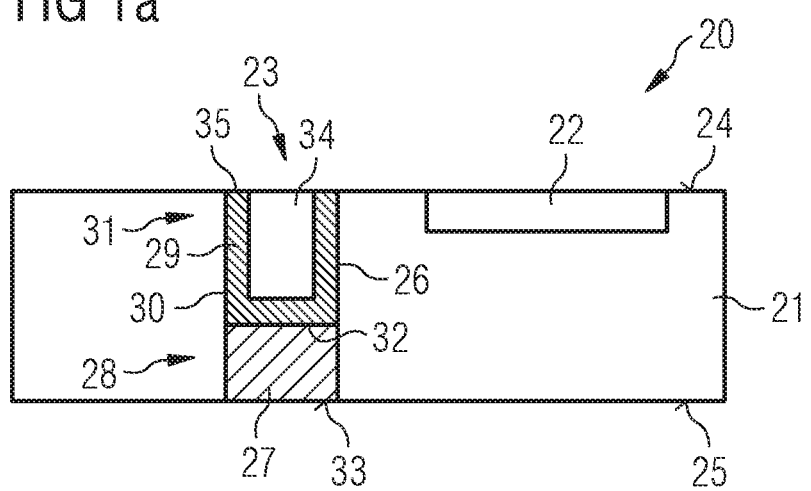
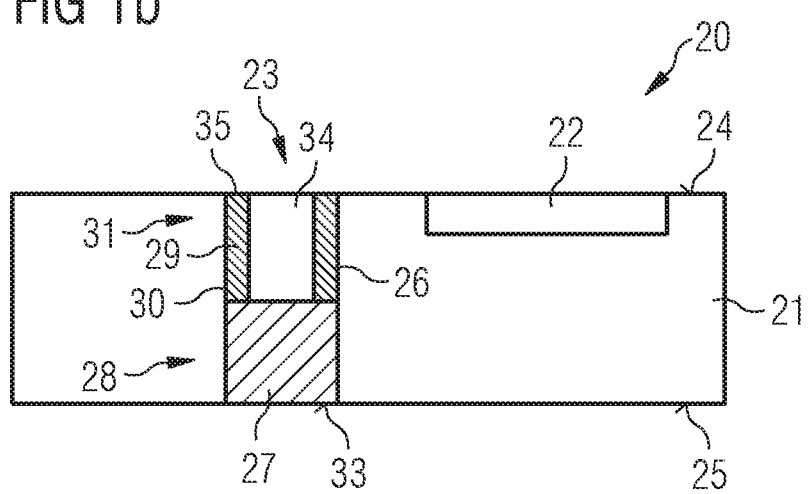

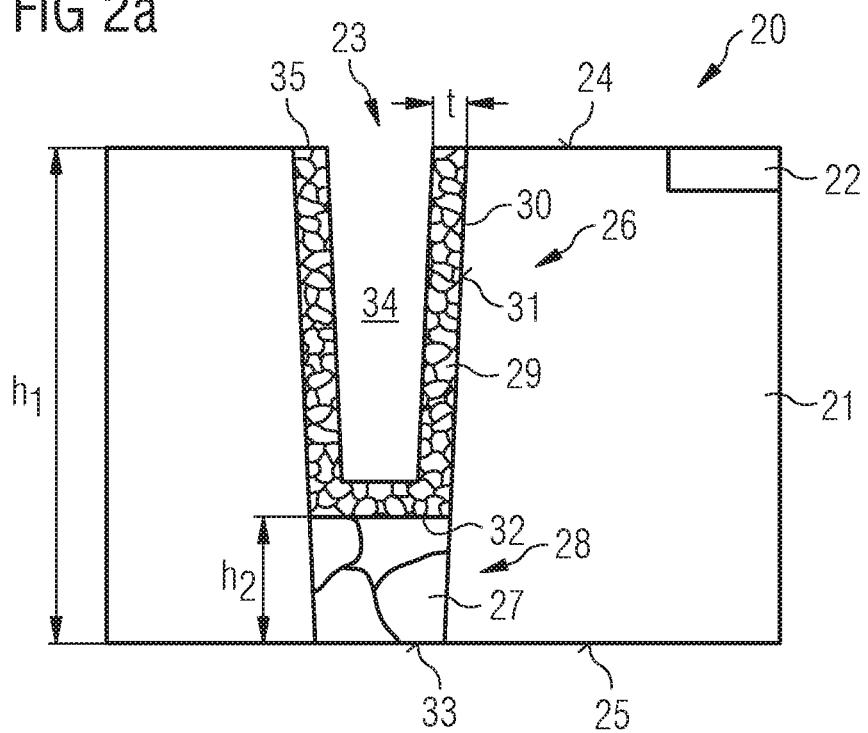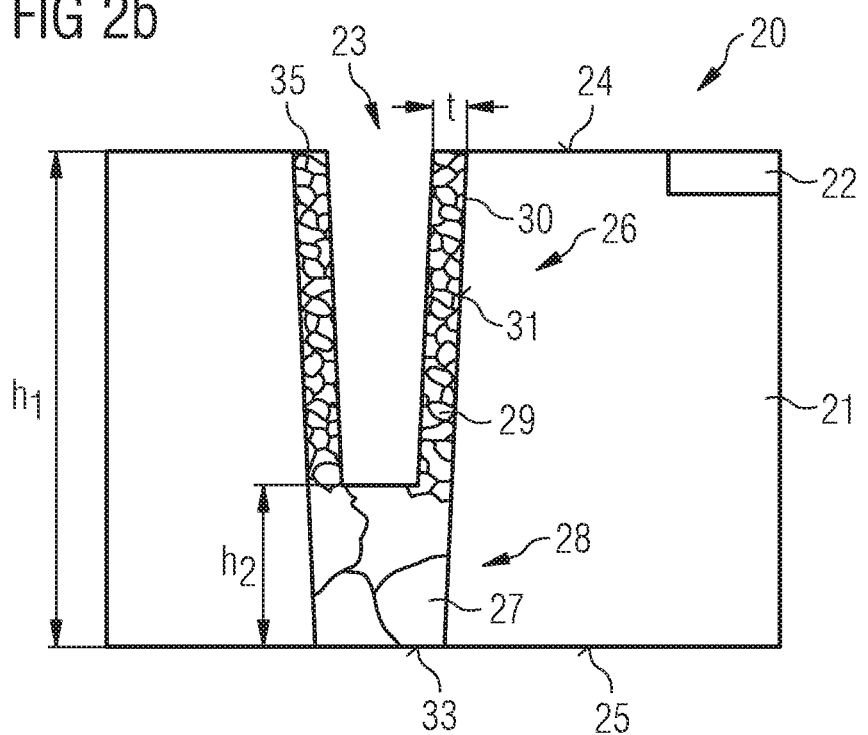

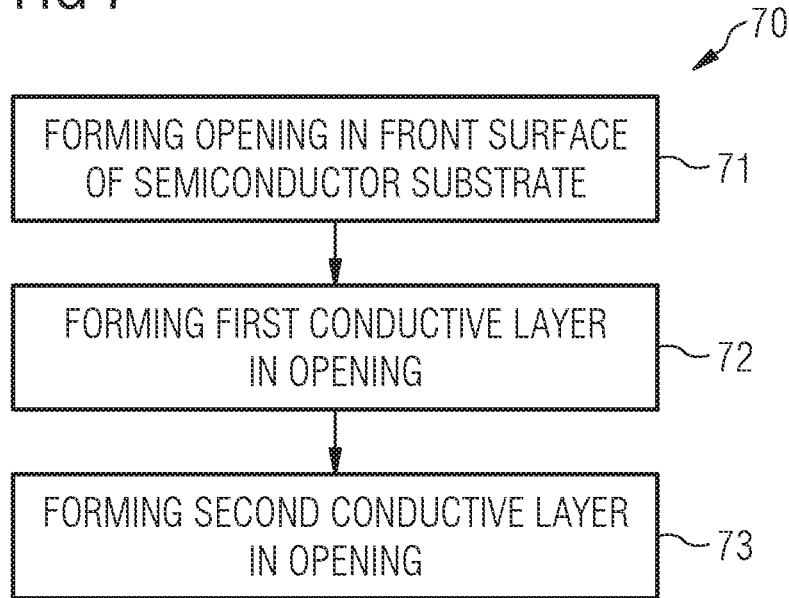
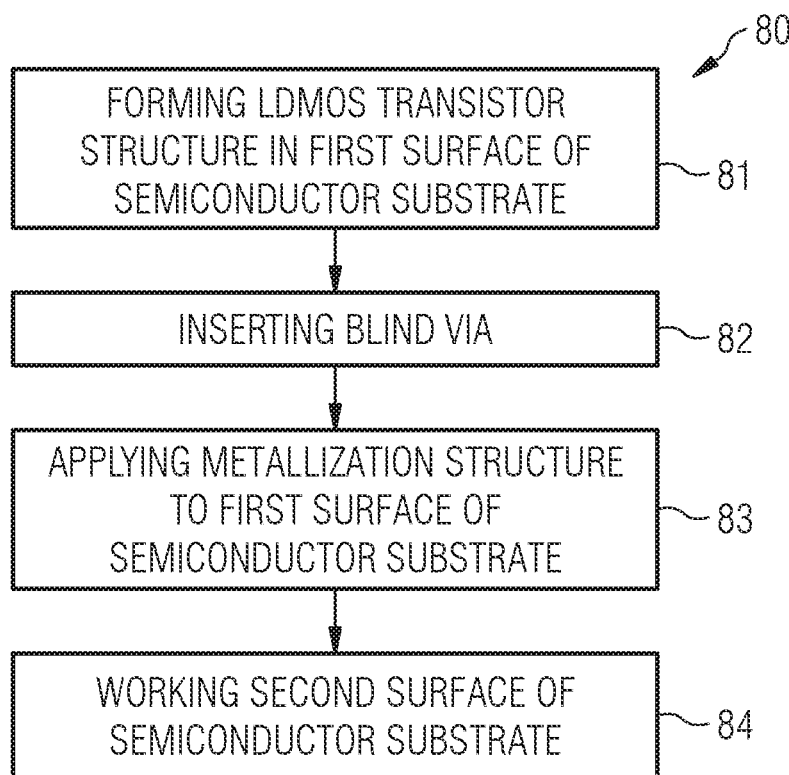

LDMOS TRANSISTOR AND METHOD

BACKGROUND

There is an ongoing need for solid state circuits adapted to operate at higher and higher frequencies, including microwave frequencies. As used herein, the term "microwave" is intended to refer to frequencies at or above about 300 MHz such as between 300 MHz and 3 GHz. Various transistor structures have been created that are capable of providing gain in such frequency ranges. A LDMOS (Lateral Diffused Metal Oxide Semiconductor) transistor is an example of such a transistor structure.

In some lateral transistor devices, such as a LDMOS transistor device, the source is typically coupled to the rear side of the substrate an which the transistor structure is formed. The source may be coupled by a highly doped region of the substrate, commonly known as a sinker structure, or a conductive through substrate via (TSV) to the rear surface of the substrate.

Further improvements to the connection between the source and the rear surface of the substrate are desirable.

SUMMARY

In an embodiment, a semiconductor device includes a semiconductor substrate, a LDMOS transistor arranged in a front surface of the semiconductor substrate and a conductive through substrate via. The conductive through substrate via includes a via extending from the front surface to a rear surface of the semiconductor substrate, a conductive plug filling a first portion of the via and a conductive liner layer lining side walls of a second portion of the via and electrically coupled to the conductive plug.

In an embodiment, a method includes forming an opening in a first surface of a semiconductor substrate having a LDMOS transistor structure in the first surface, forming a first conductive layer in a first portion of the opening in the semiconductor substrate using first deposition parameters such that the first conductive layer fills the opening in the first portion, and forming a second conductive layer on the first conductive layer in a second portion of the opening using second deposition parameters such that the second conductive layer bounds a gap in the second portion.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1*a* illustrates a cross-sectional view of a semiconductor device including a LDMOS transistor and a conductive through substrate via (TSV).

FIG. 1*b* illustrates a cross-sectional view of a semiconductor device including a LDMOS transistor and a conductive through substrate via (TSV).

FIG. 2*a* illustrates the conductive through substrate via of FIG. 1*a*.

FIG. 2*h* illustrates the conductive through substrate via of FIG. 1*b*.

FIG. 7 illustrates a flow chart of a method for fabricating a conductive through substrate via.

FIG. 8 illustrates a flow chart of a method for fabricating a LDMOS transistor device with a conductive through substrate via.

DETAILED DESCRIPTION

Figure 3:
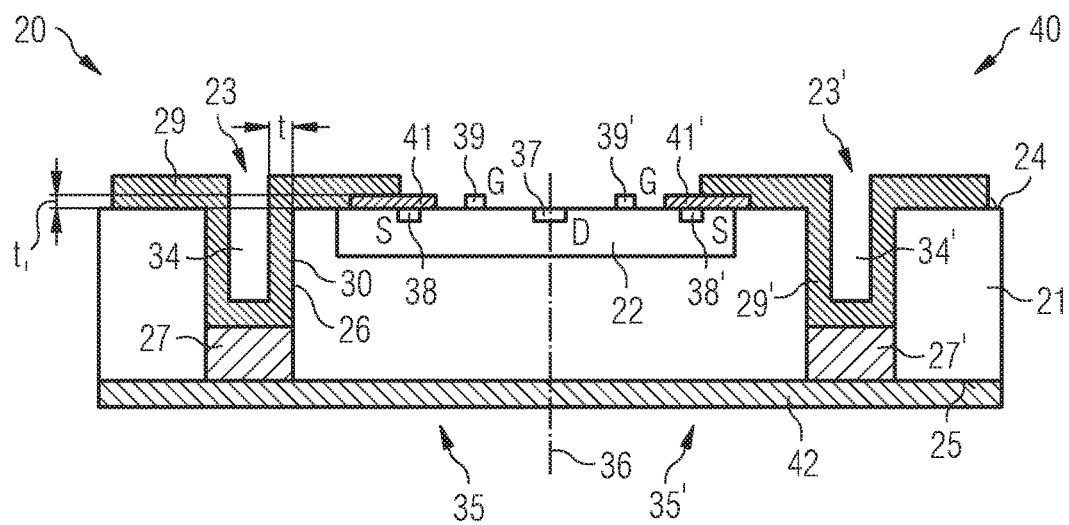
FIG. 3 illustrates a cross-sectional view of the semiconductor device including the LDMOS transistor and conductive through substrate via (TSV).

In the following detailed description, reference is made to the accompanying drawings, which form a part hereof, and in which is shown by way of illustration specific embodiments in which the invention may be practiced. In this regard, directional terminology, such as "to", "bottom", "front", "back", "leading ", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled." to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

It will be understood by those of skill in the art that the active device(s), such as a LDMOS transistor, may be formed on or over the substrate or entirely within the substrate or partly within and partly on or over the substrate, depending upon the nature of the device(s). Accordingly, as used herein with respect to the active device(s), the terms "in the substrate", "in the semiconductor substrate" and equivalents are intended to include all such variations.

FIGS. 1a and 1b illustrate a semiconductor device 20 including a semiconductor substrate 21, a LDMOS (Laterally Diffused Metal Oxide Semiconductor) transistor 22 and a conductive through substrate via (TSV) 23. The semiconductor substrate 21 includes a front surface 24 and a rear surface 25. The LDMOS transistor 22 is arranged. In the front surface 24 of the semiconductor substrate 21. The conductive through substrate via 23 includes a via 26 which extends from the front surface 24 to the rear surface 25 of the semiconductor substrate 21, a conductive plug 27 which fills a first portion. 28 of the via 26 and a conductive liner layer 29 which lines sidewalls 30 of a second portion 31 of the via 26 which is electrically coupled to the conductive plug 27.

The via 26 may also be called a through-hole and has side walls 30 formed from the material of the semiconductor substrate 21. The conductive plug 27 fills the via 26 and may be arranged at a base of the via 26 and have a lower surface 33 which is substantially coplanar with the rear surface 25 of the semiconductor substrate 21. The conductive liner layer 29 may surround a gap 34 within the via 26. The conductive liner layer 29 may extend from the conductive plug 27 to the front surface 24 of semiconductor substrate 21 such that the conductive liner layer 29 and the conductive plug 27 form a conductive path from the front surface 24 to the rear surface 25 through the thickness of the semiconductor substrate 21.

The semiconductor substrate 21 may have a bulk resistivity of greater or equal to 100 Ohm.cm and may be described as highly resistive. In some embodiments, the semiconductor substrate 21 includes silicon and may include a silicon single crystal.

When the bulk resistivity of the semiconductor substrate is equal or greater than a predetermined level, the substrate related inductive and capacitive parasitics can be reduced. The desirable predetermined level is usefully equal or greater than 100 Ohm.cm resistivity, conveniently equal or greater than about 500 Ohm.cm resistivity, more conveniently equal or greater than about 1000 Ohm.cm resistivity. As used herein, the term "bulk resistivity" refers to those portions of substrate 21 that lie outside the device regions, e.g., outside of the doped regions of the LDMOS transistor and any associated RESURF structure.

In the embodiment illustrated in FIG. 1a, the conductive liner layer 29 may be positioned directly on the conductive plug 27 forming a substantially horizontal interface 32 between the conductive plug 27 and the conductive liner layer 29.

This arrangement including an interface 32 between an upper surface of the conductive plug 27 and the lower surface of a base of a U-shaped conductive liner layer 29 may be produced after deposition of the conductive liner layer 29 on the conductive plug 27. The conductive liner layer 29 may surround a gap 34 within the via 26 which is open at the first surface 24 of the semiconductor substrate 21.

FIG. 1b illustrates a semiconductor device 20 in which the semiconductor substrate 21 is subjected to an annealing treatment during subsequent processing of a device having an arrangement including an interface 32 between an upper surface of the conductive plug 27 and the base of a U-shaped conductive liner layer 29. This subsequent annealing treatment can result in grain growth of the material of the conductive plug 27 and conductive liner layer 29 such that the interface is no longer discernible and a conductive liner layer 29 is formed on the side walls of the via 26 and periphery of an upper surface of the conductive plug 27 which has a different microstructure from the conductive plug 27, for example a smaller grain size. In this embodiment, the central portion of the upper surface of the conductive plug 27 forms the base of the gap 34.

In some embodiments, the semiconductor substrate 21 includes a highly doped silicon substrate, such as a silicon wafer, and an epitaxial silicon layer based on the highly doped silicon substrate. The LDMOS transistor is arranged in the front surface of the epitaxial silicon layer.

The structure of the conductive through substrate via 23 of FIGS. 1a and 1b is illustrated in more detail in FIGS. 2a and 2b, respectively. The conductive plug 27 as lateral area which is the same as the lateral area of the via 26 such that the conduct plug 27 fills the volume of a portion of the via. 26, whereas the conductive liner layer has a thickness which is less than the width of the via 26 so that the conductive liner layer 29 surrounds a gap 34. The gap 34 is positioned above the conductive plug 27 within the via. 26. The conductive liner layer 29 extends from the conductive plug 27 to the front surface 24. The conductive liner layer 29 and the conductive plug 27 may have different microstructures. For example, the conductive plug 27 may include a grain size which is larger than a grain size of the conductive liner layer 29. The differing microstructures may result from differing conditions used to deposit the conductive plug 27 and conductive liner layer 29 in the via 26.

In an embodiment, different electrochemical processing baths which include different chemical additive systems are used to deposit the conductive plug 27 and the conductive liner layer 29. The chemical additive system may be identified in the final produce using analytical techniques, such as TOF-SIMS (Time-Of-Flight Secondary Ion Mass Spectrometry).

The conductive liner layer 29 and the conductive plug 27 may include the same material, for example the same metal. In some embodiments, the conductive liner layer 29 and the conductive plug 27 include high purity copper.

The conductive plug 27 has a height $h_2$ which is greater than the thickness t of the conductive liner layer, for example, $h_2 \pm 3t$. In some embodiments, 0.5 µm≤t≤3 µm and 5 µm≤$h_2$≤50 µm.

The conductive through substrate via 23 may have a height $h_1$ and the conductive plug 27 may have a height $h_2$ whereby $h_2$ may be less than or equal to ⅔ $h_1$, i.e., $h_2 \leq 2h_1/3$. In some embodiments, 20 µm≤$h_1$≤100 µm and 5 µm≤$h_2$≤70 µm.

One or more further layers providing adhesion promotion, a diffusion barrier and/or a seed layer may be arranged between the material of the semiconductor substrate 21 defining the side walls 30 of the via 26, the conductive plug 27 and the conductive liner layer 29.

The conductive liner layer 29 is electrically coupled to an electrode of the LDMOS transistor, such as the intrinsic source. In some embodiments, the conductive liner layer 29 extends onto regions of the first surface 24 adjacent the via 26 and may be positioned on or directly on a further conductive layer which is coupled with the electrode. The electrode of the LDMOS transistor, for example the source, is electrically coupled to the rear surface 25 of the substrate 21 by the further conductive layer, the conductive liner layer 29 and conductive plug 27.

The conductive through substrate via 23 may be considered to be anisotropically filled as the conductive plug 27 fills the lateral area of the via 26, whereas the conductive liner layer 29 surrounds a gap 34 or void at the centre of the via 26. The anisotropic fill may be used to provide stress relief and simpler processing for a substrate at the wafer level and for a substrate at the device level after singulation from the wafer.

For example, the positioning of gap 34 within the via 26 may be used to prevent bowing of the semiconductor substrate 21, particularly during fabrication of arrays of conductive through substrate vias 23 at the wafer level, and may be used for stress compensation. The conductive through substrate via 23 may have improved thermal performance during thermal cycling, since the conductive material of the conductive plug 27 and conductive liner layer 29 can expand into the gap 34. Furthermore, the use of the filled base of the conductive through substrate via 23 prevents solder from entering the via during die attach, for example when the rear surface 25 is soldered onto a die pad or ground plane.

The gap 34 positioned within the upper portion 31 of the via 26 may be open at the upper surface 24. In some embodiments, the first end 35 of the conductive via 23 is sealed at the front surface 24 to produce a cavity within the upper portion 31 of the conductive through substrate via 23 and within the conductive liner layer 29. The lateral area of the conductive through substrate via 23 formed by the gap 34 or cavity, if present, may be around 4% of the total surface area of the substrate 21.

The via 26 and the conductive through substrate via 23 may have different lateral forms, for example an elongate form, such as a rectangle, a circular or square or hexagonal lateral shape.

In some embodiments, two or more conductive through substrate vias 23 may be provided in a semiconductor device 20. For example, a plurality of conductive through substrate vias 23 may be provided and arranged in one or more rows or a regular array. Each conductive through substrate via 23 may have a substantially rectangular lateral form and may be called a trench. Two or more of the conductive through substrate vias 23 may be used to provide a single conductive connection, for example a ground connection.

One or more of the conductive through substrate vias 23 may be coupled to the intrinsic source of two LDMOS transistor structures, for example a LDMOS transistor structure arranged each one of two opposing sides of the one or more conductive through substrate vias 23.

Figure 4:
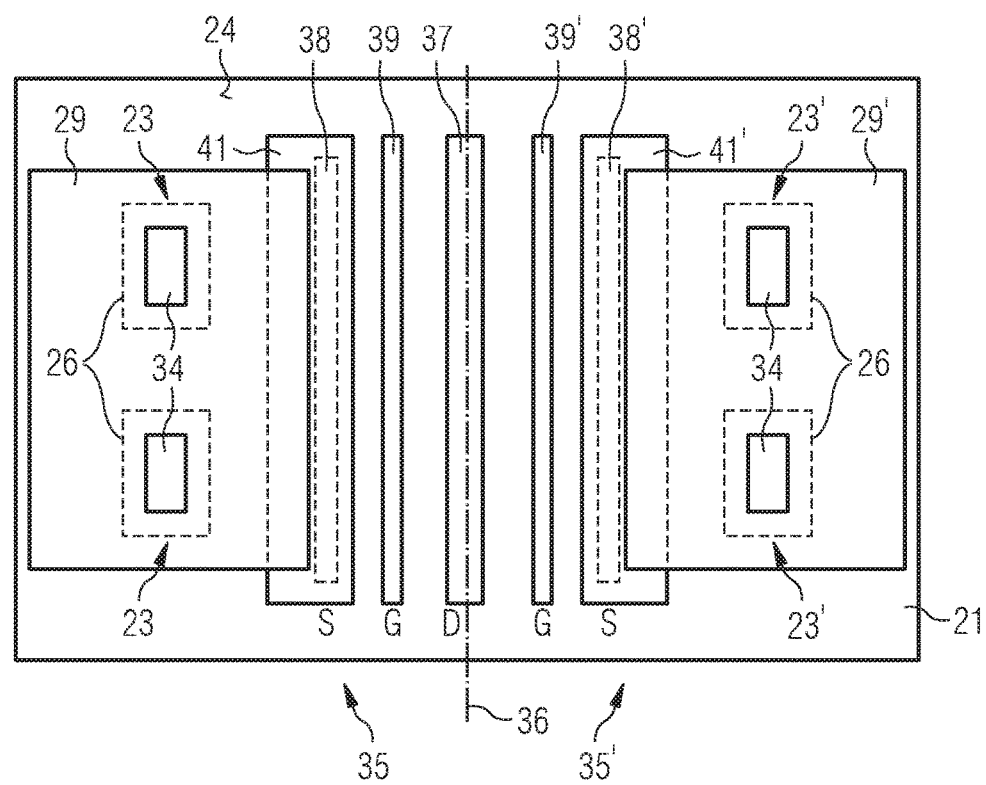
FIG. 4 illustrates a plan view of the semiconductor device of FIG. 3.

FIG. 3 illustrates the semiconductor device 20 and, in particular, the arrangement of the conductive through substrate via 23 with respect to the LDMOS transistor 22 in more detail. FIG. 4 illustrates a plan view corresponding to the view of FIG. 3.

The LDMOS transistor 22 includes a plurality of transistor cells or segments which are coupled in parallel with one another FIG. 3 illustrates two transistor cells 35, 35' which have a symmetric arrangement about a centreline 36, whereby a drain 37 which is common to both transistor cells 35, 35' is arranged symmetrically at the centreline 36. Each transistor cell 35, 35' includes a source 38 and a gate 39 arranged laterally between the source 38 and the drain 37.

At least one conductive through substrate via 23 is arranged laterally adjacent and spaced apart from the source 38 of each transistor cell 35, 35'. A conductive path is provided from the front surface 24 to the rear surface 25 by the conductive material which is inserted in the through substrate via 23, i.e., the conductive plug 27 and the conductive liner layer 29. The through substrate via 23 may have the structure illustrated in FIGS. 1a and 2a or 1b and 2b.

The conductive liner layer 29 may be conformally deposited such that it covers the upper surface of the conductive plug 27 and the sidewalls 30 and extends laterally onto the front surface 24 of the substrate 21 in regions adjacent the via 26.

The semiconductor device 20 includes a metallisation structure 40 arranged on the front surface 24 of the of the LDMOS transistor 22. The metallisation structure 40 may include a second conductive layer 41 in the form of a source metal contact which is arranged on the intrinsic source 38 and which extends laterally outwardly from the centreline 36 in the direction of the through substrate via 23. The second conductive layer 41 may include Ti.

The distal portion of the conductive liner layer 29, which extends inwardly with respect to the centreline 36, is arranged on the distal portion of the second conductive layer 41 and to provide a large area surface-to-surface contact between the conductive liner layer 29 and the second conductive layer 41 to electrically couple the intrinsic source 38 to the rear surface 25 of the substrate 21. A third conductive layer 42 may be arranged on the rear surface 25 that is in direct contact with the conductive plug 27 within the via 26. The third conductive layer 42 may have a solderable surface or include solder to enable the semiconductor substrate 21 to be mounted on, and electrically coupled to, a die pad or ground plane of a package.

FIG. 4 illustrates a plan view of the front surface 24 of the semiconductor device 20. The source 38, gate 39 and drain 37 of each of the transistor cells 35, 35' have a strip-like elongate form and extend substantially parallel to one another. The conductive through substrate via 23 may be one of a plurality of conductive through substrate vias arranged in a row laterally outward of the intrinsic source 38 with respect to the centreline 36.

The conductive liner layer 29 is arranged on the side walls 30 of the via 26 and extends onto the front surface 24 in regions adjacent the via 26. The conductive liner layer 29 overlaps with, and is arranged directly on, a distal portion of the second conductive layer 41 which is arranged on and electrically coupled with the intrinsic source 38. A portion of the second conductive layer 41 is uncovered by the conductive liner layer 29 and is positioned laterally inwardly of the conductive liner layer 29. The conductive liner layer 29 is arranged laterally adjacent and spaced apart from the source 38. If a plurality of conductive through substrate vias 23 are provided, they may be arranged in a row which extends substantially parallel to the intrinsic source 38.

A plurality of conductive through substrate vias 23 may be electrically coupled together by the conductive liner layer 29 and the second conductive layer 41.

The conductive liner layer 29 has a thickness t and the second conductive layer 41 has a thickness $t_1$, wherein $t/20 \leq t_1 \leq t/2$. The conductive liner layer may include high purity copper and the second conductive layer 41 may include tungsten or titanium nitride.

Figure 5:
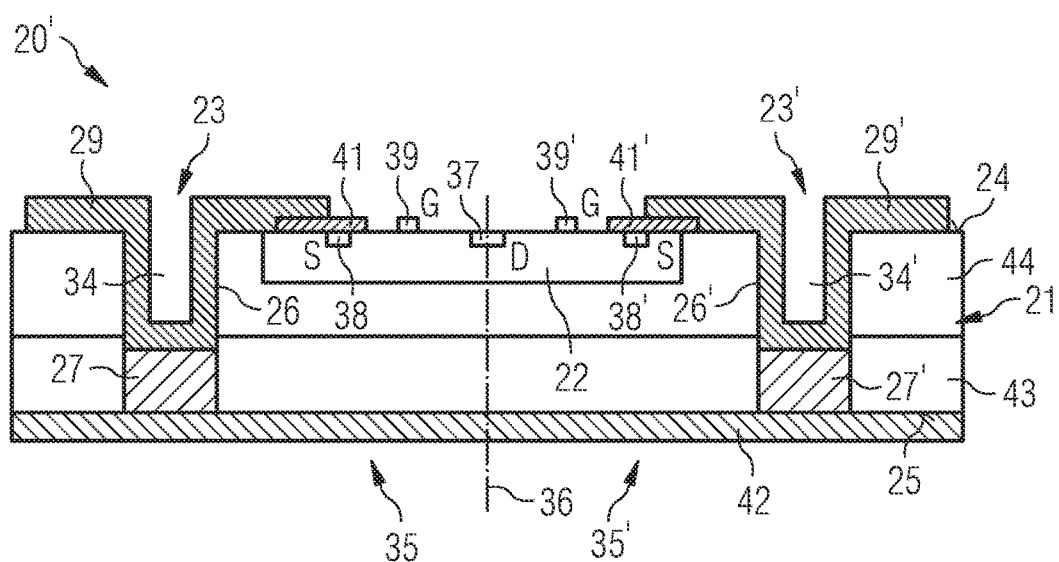
FIG. 5 illustrates a cross-sectional view of a semiconductor device including a LDMOS transistor and a conductive through substrate via (TSV).

FIG. 5 illustrates a cross-sectional view of a semiconductor device 20' which differs from the semiconductor device 20 solely in the semiconductor substrate 21. The semiconductor device 20' includes a highly doped semiconductor substrate 43 and an epitaxial layer 44 on the highly doped semiconductor substrate 43. The highly doped semiconductor substrate 43 may include a p+ doped silicon wafer and the epitaxial layer 44 p-doped silicon.

Figure 6:
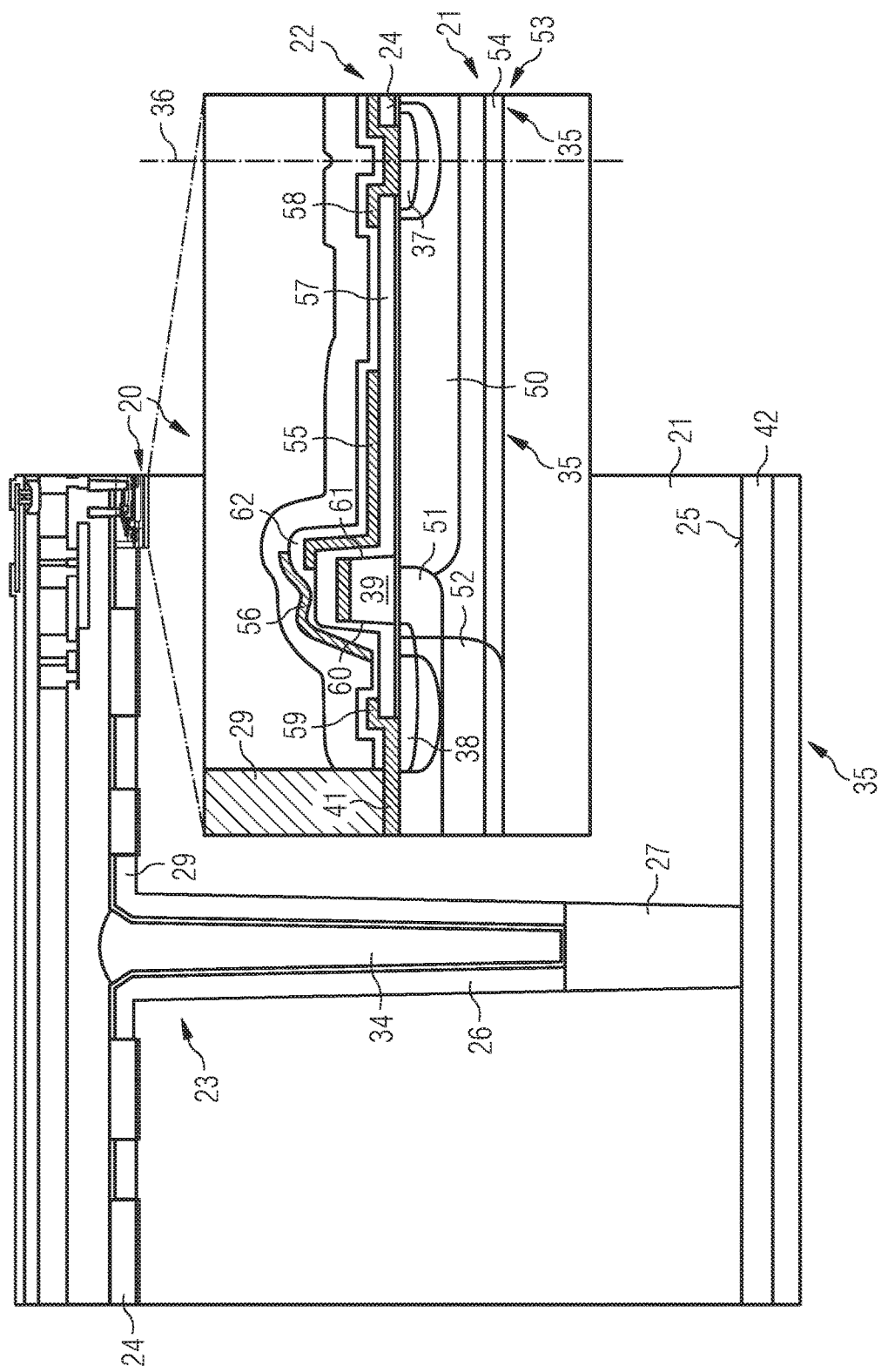
FIG. 6 illustrates an LDMOS transistor structure in a semiconductor device including a conductive through substrate via (TSV).

FIG. 6 illustrates a more detailed view of a LDMOS transistor structure 22 in the insert which may be used in the semiconductor device 20. The LDMOS transistor 22 includes a plurality of transistor cells 35, each including a doped source region 38, a doped drain region 37 and a gate 39 arranged in the front surface 24 of the semiconductor substrate 21. The gate 39 is laterally arranged between the source region 38 and drain region 37. The gate 39 may be asymmetrically arranged between source region 38 and drain region 37 such that the distance between the source region 38 and the gate 39 is less than the distance between the gate 39 and the drain region 37.

In some embodiments, the semiconductor substrate 21 may include silicon which is lightly doped with a first conductivity type, for example p−−, and highly resistive with a bulk resistivity of greater than or equal to 100 Ohm.cm. In other embodiments, in which the semiconductor substrate 21 includes a highly doped substrate and an epitaxial layer, the highly doped substrate may be p+ and the epitaxial layer p-doped.

The source region 38 is highly doped with a second conductivity type, for example n+, and the drain region 37 which is highly doped with the second conductivity type, for example n+.

A drift region 50 extends into the front surface 32 under the gate 39 in the direction of the drain region 37 and may be doped with the second conductivity type, for example n. The drift region 50 may extend further into the semiconductor substrate 31 than the drain region 37. The drift region 50 is doped with the second conductivity type, for example n, and has a dopant concentration which is less than the dopant concentration of the drain region 37 and of the source region 38.

The LDMOS transistor 22 further includes a channel region 51 doped with the first conductivity type, for example p, which extends from the drift region 50 under the source region 38 and a body contact region 52 which is doped with the first conductivity type and extends from the front surface 32 into the semiconductor substrate 31 deeper than the channel region 51. The drift region 50 extends into the semiconductor substrate 31 by a greater distance than a channel region 51. The body contact region 52 is provided by a highly doped well of the first conductivity type, for example p+.

The drain region 37 has doping concentration usefully at least $5.10^{19} \text{cm}^{-3}$, conveniently at least $1.10^{20} \text{cm}^{-3}$ and more conveniently at least $3.10^{20} \text{cm}^{-3}$, but higher or lower doping concentrations may also be used. The drift regions 50 laterally abut the drain region 37 in a symmetric structure and have a doping concentration which is usefully in the range of $1.10^{16} \text{cm}^{-3}$ to $1.10^{18} \text{cm}^{-3}$, conveniently in the range of $7.10^{16} \text{cm}^{-3}$ to $3.10^{17} \text{cm}^{-3}$, and more conveniently in the range of $1.10^{17} \text{cm}^{-3}$ to $2.10^{17} \text{cm}^{-3}$, but higher or lower doping concentrations may also be used. Laterally outboard of drift regions 50 with respect to the centre line 36 are channel regions 51 underlying at least a portion of gate 39. The channel regions 51 have a doping concentration usefully in the range of $1.10^{17} \text{cm}^{-3}$ to $2.10^{18} \text{cm}^{-3}$, conveniently in the range of $3.10^{17} \text{cm}^{-3}$ to $1.10^{18} \text{cm}^{-3}$, and more conveniently in the range of $5.10^{17} \text{cm}^{-3}$ to $9.10^{17} \text{cm}^{-3}$, but higher or lower doping concentrations may also be used. Laterally outboard of channel regions 51 are source regions 38. Source regions 38 have doping concentration usefully of at least $5.10^{19} \text{cm}^{-3}$, conveniently of at least $1.10^{20} \text{cm}^{-3}$, and more conveniently of at least $3.10^{20} \text{cm}^{-3}$, but higher or lower doping concentrations may also be used. Laterally outboard of source regions 38 are the body contact regions 52. The body contact regions 52 have doping concentration usefully in the range of $1.10^{18} \text{cm}^{-3}$ to $1.10^{20} \text{cm}^{-3}$, conveniently in the range of $2.10^{18} \text{cm}^{-3}$ to $7.10^{19} \text{cm}^{-3}$, and more conveniently in the range of $5.10^{18} \text{cm}^{-3}$ to $5.10^{19} \text{cm}^{-3}$, but higher or lower doping concentrations may also be used. The substrate 31 may have a doping concentration in the range of $1.10^{17} \text{cm}^{-3}$ to $2.10^{10} \text{cm}^{-3}$.

When the gate 39 is appropriately biased, a conductive channel forms between the source region 38 and the drain region 37. The exemplary conductivity types presented above are suitable for forming an N-channel structure, but a P-channel structure can also be formed by appropriate interchange of conductivity type of the various doped regions and appropriate modification of the bias on gate 39.

In embodiments in which the LDMOS transistor 22 includes a substrate with a bulk resistivity of greater or equal to 100 Ohm.cm, it may further include a RESURF structure 53. The RESURF structure 53 may include a doped buried layer 54, a field plate 55 and a doping profile of the buried layer 54. The RESURF structure 53 is provided to reduce the electric field at the front surface 24 of the semiconductor substrate 21 and, in particular, the electric field at the front surface 24 of the semiconductor substrate 21 at the drain-side edge of the gate 39 and in the direction of the drain 37. The RESURF structure 53 may be used to increase the breakdown voltage of the transistor whilst maintaining a low on-resistance.

The doped buried layer 54 of the RESURF structure 53 extends continuously through out the lateral area of the semiconductor substrate 21 and continuously under the source region 37, gate 39 and drain region 37 of the LDMOS transistor 22. The doped buried layer 54 is spaced apart from the drift region 51 and the channel region 52 by a portion of the semiconductor substrate 21. The doped buried layer 54 has a dopant concentration of the first conductivity type which is greater than the dopant concentration of the semiconductor substrate 21 and less than the dopant concentration of the channel region 52. The doped buried layer 54 may have a doping concentration in the range of $1.10^{13} \text{cm}^{-3}$ to $2.10^{15} \text{cm}^{-3}$.

The semiconductor device 20 may include a first dielectric layer 57, for example an oxide layer, on the front surface 24 of the semiconductor substrate 21 which is structured and has an opening above the drain region 37 in which a drain metal contact 58 is formed and an opening over the source region 38 in which a source metal contact 59 is formed. The source metal contact 59 extends into the conductive layer 41. The first dielectric layer 57 covers the gate 39 and extends between the source sided gate edge 60 and the source metal contact 59 and between the drain sided gate edge 61 and the drain metal contact 58.

The field plate 55 is positioned on the first dielectric layer 57 above the gate 39 and extends on the first dielectric layer 57 in the direction of the drain metal contact 58.

A dielectric layer 62 is arranged on the field plate 55 and extends over the gate 39, the source metal contact 59 and the drain metal contact 58. A gate shield 56 is positioned on the dielectric layer 62 on the gate 39 and partially overlaps with the field plate 55. The gate shield 56 extends from the gate 21 in the direction of the source region 19.

The source region 38 of the LDMOS transistor 22 is coupled to the rear surface 25 of the semiconductor substrate 21 by the conductive layer 41 and conductive through substrate via 23. The conducive through substrate via 23 may be positioned such that the body contact 52 surrounds the upper portion of the conductive through substrate via 23.

FIG. 7 illustrates a flow chart 70 of a method for fabricating a conductive via, such as the conductive through substrate via 23, in a semiconductor substrate including an LDMOS transistor structure in a first surface. In block 71, an opening is formed in the first surface of the semiconductor substrate including an LDMOS transistor structure in the first surface. In block 72, a first conductive layer is formed in a first portion of the opening in the semiconductor substrate using first deposition parameters such that the first conductive layer fills the opening in the first portion. In block 73, a second conductive layer is formed on the first conductive layer in a second portion of the opening using second deposition parameters such that second conductive layer surrounds a gap in the second portion.

As an example, the first conductive layer and the second conductive layer may be formed by electrodeposition techniques. The first conductive layer may form a conductive plug and the second conductive layer may form a conductive liner layer. The second conductive layer may be formed directly on the first conductive layer and form a substantially horizontal interface therebetween. In some embodiments, the second conductive layer may extend from a periphery of the first conductive layer on side walls of the opening. The first and second conductive layers may be distinguishable by their respective microstructures. For example, the first conductive layer may have a larger average gran size than the second conductive layer.

The first deposition parameters may be selected to favour the growth of the first conductive layer in the vertical direction with respect to major surface of the substrate and the second deposition parameters may be selected to favour growth of the second conductive layer in a lateral direction with respect to the major surface of the substrate. The first and second deposition parameters may be selected such that the first conductive layer has the form of a conductive plug having a height hi and the second conductive layer has a thickness t, whereby $h_1 \geq 3t$.

In some embodiments, the substrate is subjected to an annealing treatment during subsequent processing of the arrangement. This subsequent annealing treatment can result in grain growth of the material of the first and second conductive layers such that the interface is no longer discernible. However, the portion of the second conductive layer formed on the side walls of the opening and at the periphery of the first conductive layer may have a different microstructure from the first conductive layer, for example a smaller grain size, so that the two conductive layers are discernible.

In some embodiments, the opening has the form of a blind via, or closed-end via, and the first conductive layer is applied to the base of the blind via such that the base portion of the blind via is filled with the first conductive layer. In some embodiments, the blind via is filled to a depth of 10% to 70% of the total depth of the blind via. The second layer may be positioned directly on the first layer to from an interface and extend along the side walls to the open end of the via at the first surface. In some embodiments, the second layer further extends onto the first surface of the semiconductor substrate and is electrically coupled to the LDMOS transistor structure. In order to provide a conductive path between the front surface and the rear surface of the final substrate, the rear surface adjacent the blind via may be worked to move material until a portion of the conductive plug is exposed and the substrate has the desired thickness.

FIG. 8 illustrates a flow chart of a method 80 for fabricating a LDMOS transistor device. In block 81, a LDMOS transistor structure is formed in a first surface of a semiconductor substrate. In block 82, a blind via is inserted into the front surface, the base of the blind via filled to a predetermined depth with conductive material and a conductive liner layer is formed in the via above the conductive material which extends from, and electrically couples, the conducive material to an intrinsic source of the LDMOS transistor. In block 83, a metallization structure is applied to the first surface which has portions which are electrically coupled to the conductive material, intrinsic source, intrinsic drain and gate of the LDMOS transistor. In block 84, a second surface of the semiconductor substrate which opposes the first surface and the metallization structure is worked to expose a surface of the conductive material arranged at the base of the via.

The conductive through substrate via is formed after the formation of the LDMOS transistor structure in the first surface of the semiconductor substrate and before the deposition of the metallization structure on the first surface.

During insertion of the via into the semiconductor substrate and the fabrication of the conductive via, the LDMOS transistor structure may be covered by one or more insulating layers. After applying the second conductive layer and before applying the metallization structure to the first surface, the gap in the second portion of the opening may be capped, for example by inserting a resist plug, the front surface planarized, for example by Chemical Mechanical Polishing (CMP) and the resist plug removed.

In an embodiment, the conductive liner layer is further formed on the first surface of the substrate surrounding the opening and on a conductive layer electrically coupled with an intrinsic source of the LDMOS transistor to electrically couple the intrinsic source with the first conductive layer.

In some embodiments, the gap surrounded by the conductive liner layer within the via is capped or sealed. This may be performed by forming a first insulating layer over the second conductive layer such that the first insulating layer surrounds a gap within the opening and forming a second insulating layer over the gap thereby forming an enclosed cavity or void within the opening. The enclosed cavity or void may be defined entirely bey insulating material such as a dielectric.

A method for fabricating LDMOS transistor device will now be described with reference to FIGS. 9 to 14.

Figure 9:
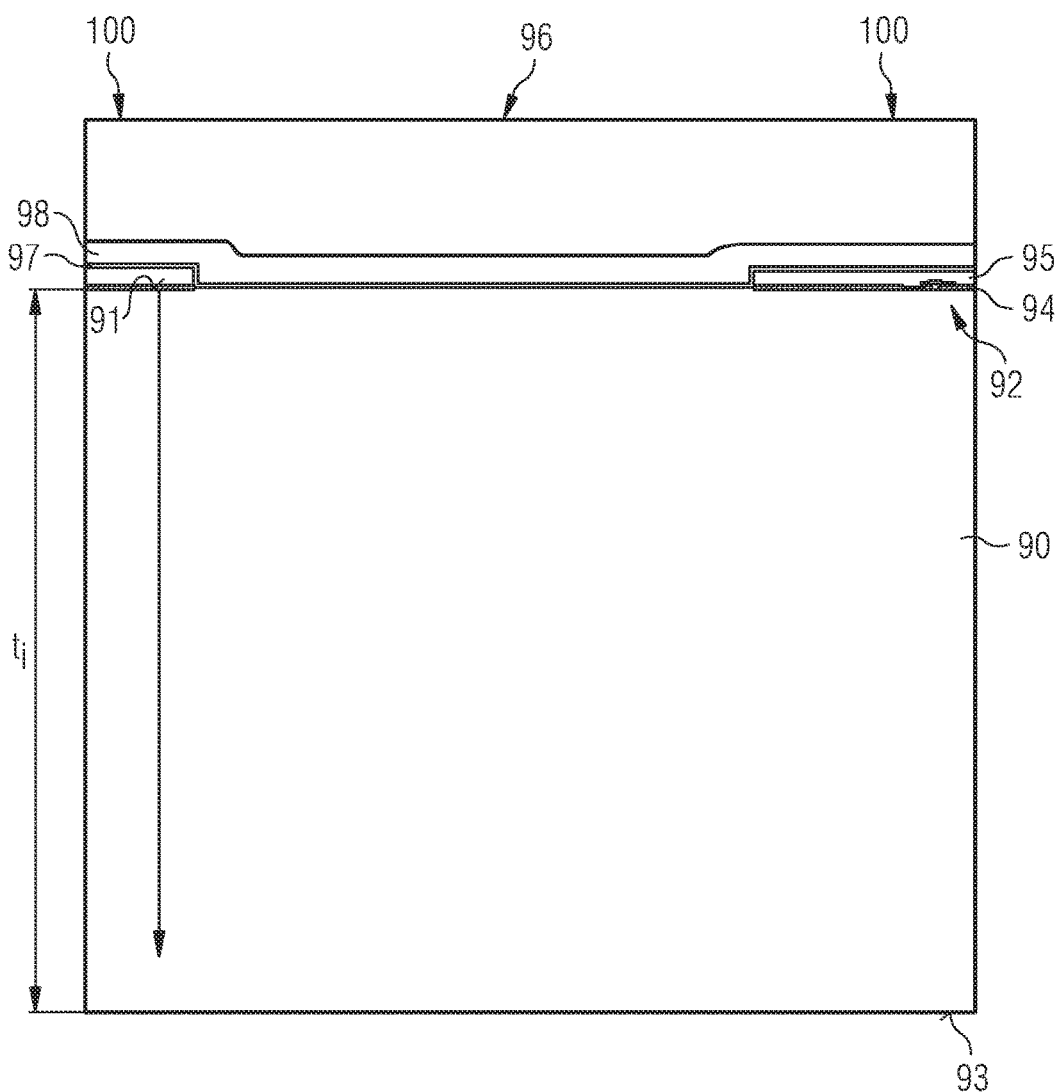
FIG. 9 illustrates a cross-sectional view of an initial semiconductor substrate.

FIG. 9 illustrates an initial semiconductor substrate 90 having a first surface 91, in which LDMOS transistor structures 92 are formed, and a rear surface 93. The semiconductor substrate 90 includes a highly resistive silicon substrate with a bulk resistivity $\rho \geq 100$ Ohm.cm and has an initial thickness $t_i$ which is greater than the final thickness of the semiconductor substrate of the LDMOS transistor device.

A plurality of LDMOS structures 92 are formed in the front surface 91 spaced apart by regions 96 in which a conductive through substrate via (TSV) will be formed. The LDMOS transistor structures may have the structure illustrated in FIG. 6, for example. The LDMOS transistor structures 92 in the front surface 91 are covered by an oxide layer 94 covering the source and drain metal contacts and a BPSG (borophosphosilicate glass) layer 95 covering the oxide layer 94. The front surface 91 of the semiconductor substrate 90 is free of the oxide layer 94 and the BPSG layer 95 in the region 96. A nitride layer 97 followed by a SiOx layer 98 are arranged in the region 96 and extend onto the surface of the BPSG layer 95.

The $SiO_x$ layer 98 may be used as a hard mask during Reactive Ion Etching (RIE) whereas the nitride layer 97 may be used to strip the remaining hard mask after selective reactive ion etching of the BPSG layer 95.

Figure 10:
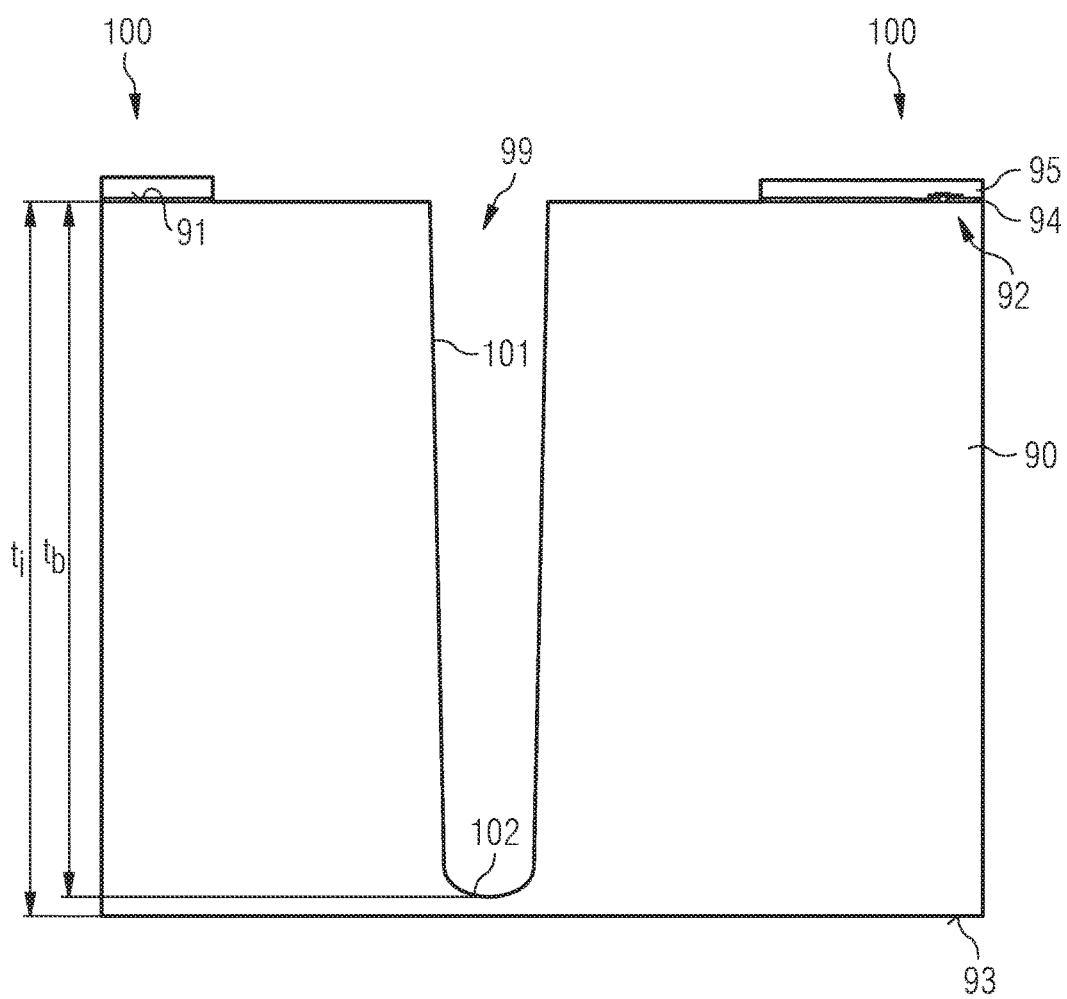
FIG. 10 illustrates a cross-sectional view of the initial semiconductor substrate of FIG. 9 with a blind via.

As is illustrated in FIG. 10, a blind via 99 is inserted into the front surface 91 of the substrate 90 in the region 96 which is positioned between active regions 100 in which the LDMOS transistor structures 92 are formed. The regions 96 and 100 may have a strip-like form and alternate across the semiconductor substrate 91. The blind via 99 has a base 102 formed by a portion of the material of semiconductor substrate 90 and has a depth $t_b$ the which is less than the initial thickness $t_i$ of the substrate 90 and which approximates the desired final thickness $t_f$ of the semiconductor substrate in the LDMOS transistor device. The blind via 99 may be inserted into the front surface 96 by reactive ion etching. The blind via is spaced apart from the LDMOS structures 92 by a portion of the highly resistive semiconductor substrate 91. The remaining SiOx layer 98 and the nitride layer 97 may then be removed from the front surface 91.

In plan view, the blind via 99 may have an elongate shape and may be substantially rectangular. The blind via 99 may be one of a plurality of blind vias which may be arranged in a row extending into the plane of the drawing which extends substantially parallel to a strip-like intrinsic source of the LDMOS transistor structure 92 or in a regular array arranged between the two active regions 100 including LDMOS transistor structures. The sidewalls 101 of the blind via 99 may be substantially perpendicular to the front surface 91 or may be slightly inclined such that the blind via 99 tapers slightly towards the base 102. As an example, the blind via 99 may have lateral dimensions of around 8 µm by 50 µm and a depth of around 60 µm.

Figure 11:
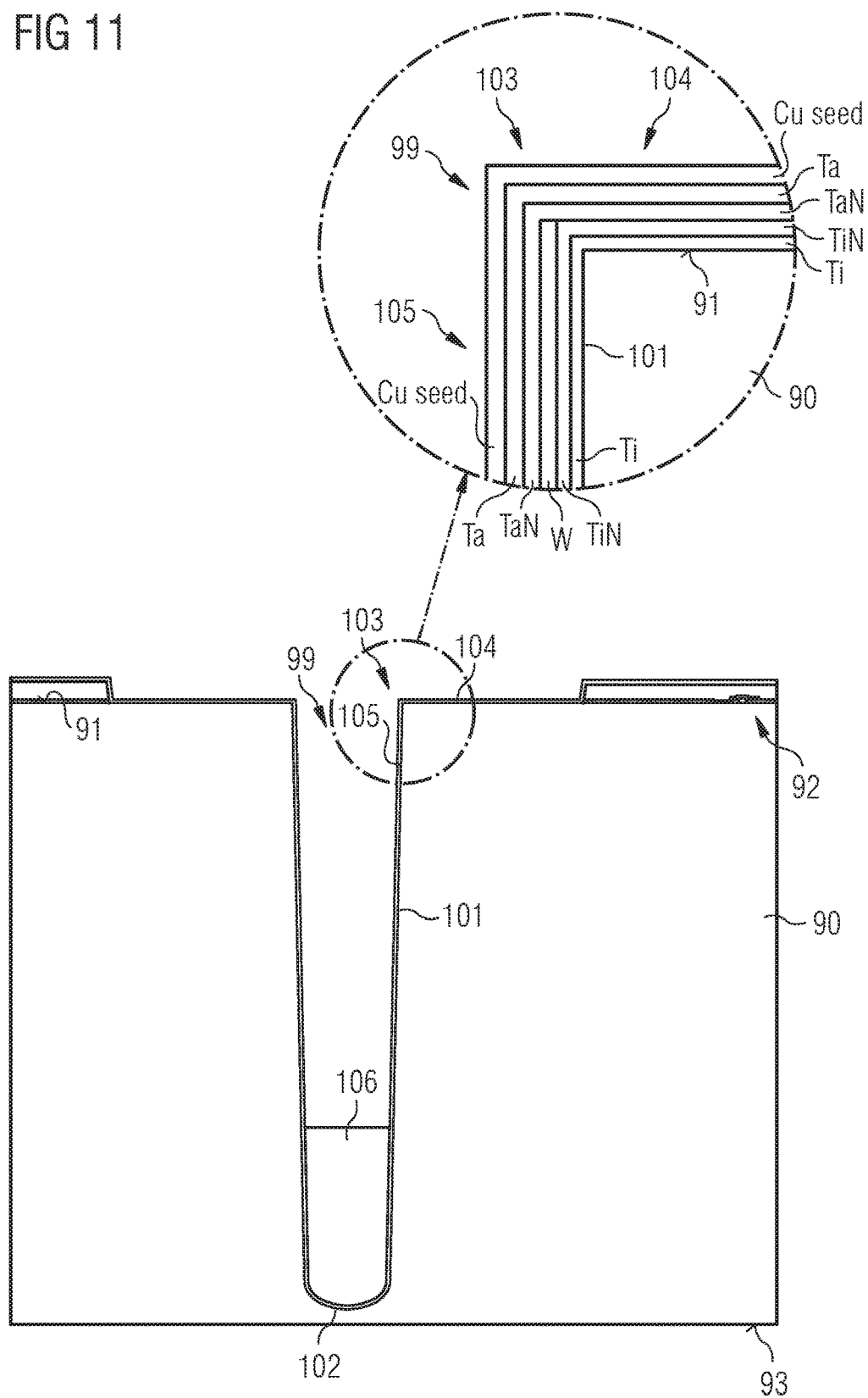
FIG. 11 illustrates a cross-sectional view of a conductive plug at the base of the blind via of FIG. 10.

FIG. 11 illustrates the deposition of a barrier layer structure 103 on sidewalls 101 of the blind via 99 and on the front surface 91 of the substrate 90. The barrier layer structure 103 may be deposited using Physical Vapour Deposition (PVD) techniques, for example sputtering, or Chemical Vapour Deposition (CVD) techniques.

The barrier layer 103 extends over the BPSG layer 95, the front surface 91 of the substrate 90 in the region 96, the sidewalls 101 and the base 102 of the blind via 99. As the semiconductor substrate 90 is highly resistive, a dielectric insulating layer is not necessarily provided on the side walls of the through substrate via before deposition of the barrier layer 103.

The barrier layer 103 may have various structures, for example a layer Of Ta, or layers of Ta/TaN or TaN/Ta or Ti/TiN deposited using PVD or Ti/TiN deposited using PVD and W/Ta deposited using CVD or PVD or Ti/TiN deposited using PVD and W/Ta/TaN deposited using CVD or PVD, or Ti/TiN deposited using PVD and W/TaN/Ta deposited using CVD or PVD and optionally further including at least one of the following:

after deposition of W using CVD, performing a W etch back process to remove W from the planar part of the wafer;

a further copper seed layer deposited by sputtering for copper electroplating, and a pre-clean, for example, wet chemical HF-last, sputter pre-clean or reduction. In hydrogen is done prior to sputtering.

The enlarged view of the insert of FIG. 11 illustrates multiple layers of the barrier layer 103 according to one embodiment. The portion 104 of the barrier layer 103 arranged on the front surface 91 of the semiconductor substrate 90 has a different number of layers from the portion 105 arranged on the side walls 101 and the base 102 of the blind via 99. In this embodiment, the portion 104 includes a structure, starting from a cleaned surface of the semiconductor substrate 90 including layers of Ti, TiN, TaN, Ta, and a Cu seed layer. The second portion 105 includes a structure, starting from a cleaned surface of the semiconductor substrate 91 forming the side wails 100 and base 102 of the blind via 99 includes layers of Ti, TiN, N, TaN, Ta, and a Cu seed layer.

After deposition of the barrier layer 103 including an outermost seed layer, conductive material is inserted into the blind via 99. In a first stage, illustrated in FIG. 11 conductive material is inserted into the base 102 of the blind via 99 to form a first conductive layer 106 which fills the volume of the blind via 99 adjacent the base 102. The first layer 106 may be deposited using electroplating techniques and may be deposited using conditions favouring vertical growth of the layer 106 with respect to the first major surface 91 while suppressing growth of lateral or substrate front side regions such that the volume of the blind via 99 is filled with the first layer 106. The first conductive layer 106 may be called a conductive plug.

Figure 12:
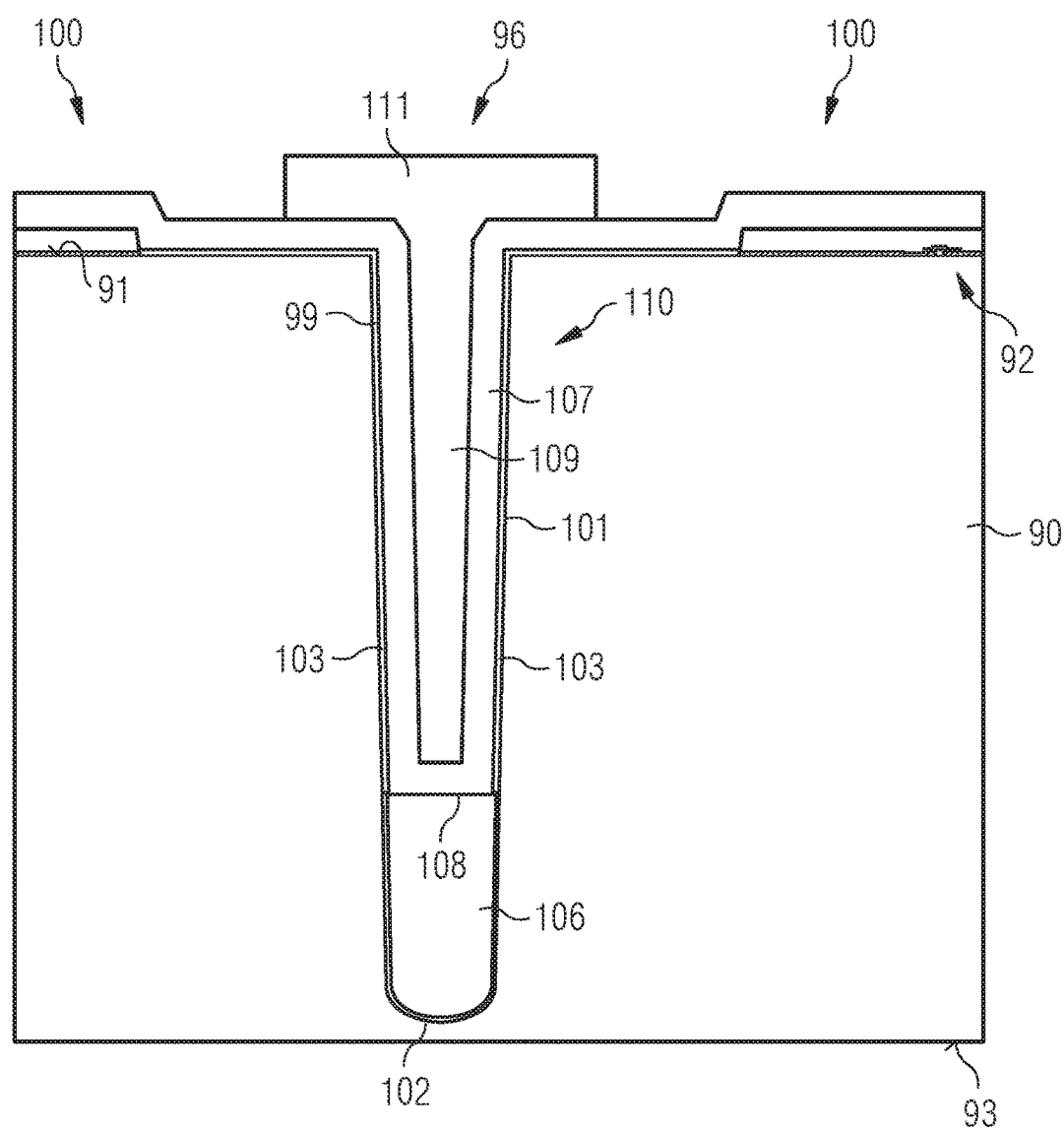
FIG. 12 illustrates a cross-sectional view of a conductive layer arranged on the conductive plug and surrounding a gap which is capped.

FIG. 12 illustrates the substrate 90 after the subsequent deposition of a second conductive layer 107 within the blind via 99. The second conductive layer 107 lines the barrier layer 103 on the sidewalls 101 of the blind via 99, the upper surface of the first layer 106 within the blind via 99 and extends over the front surface 91 of the substrate 90 and the BPSG layer 95. The second conductive layer 107 surrounds a gap 109 within the upper portion 110 of the blind via 99. The second conductive layer 107 may be deposited by electroplating techniques and may be deposited using conditions which favour conformal deposition and growth of a second conductive layer 107 such that the second conductive layer 107 lines the upper portion 110 of the blind via 99 leaving the gap 109 in the centre of the blind via 99. The second conductive layer 107 may be called a conductive liner layer. The first conductive layer 106 and the second conductive layer 107 may include high purity copper.

After deposition, an interface 108 is formed between the first conductive layer 106 and second conductive layer 107. The interface 108 is discernible as the first conductive layer 106 and the second conductive layer 107 are deposited in two deposition steps and may have different microstructures.

In embodiments, in which the substrate is subjected to a subsequent thermal treatment, the interface 108 may no longer be discernible. However, the second conductive layer arranged on side walls 101 of the blind via 99 and the first conductive layer may have different microstructures, such as different grain sizes, and be discernible.

The second conductive layer 107 may extend onto the front surface 91 of the substrate 90 and may be electrically coupled to an electrode of the LDMOS transistor structure, such as intrinsic source. Since the second layer 107 provides a vertical conductive path within the blind via 99 and a horizontal conductive path on the front surface 91, the method may be called dual damascene.

The second conductive layer 107 may be arranged directly on a conductive structure on the front surface 91 which is electrically coupled to an electrode of the LDMOS transistor structure 92, such as intrinsic source and provides a direct connection between the through substrate via and an electrode of the LDMOS transistor structure 92.

In some embodiments, the second conducive layer 107 may extend from the first conductive layer to the front surface 91 and be contained within the via. This method may be called a single damascene method.

The gap 109 within the bind via 99 may be temporarily sealed using a further material such as a resist 111. A planarization process may be carried out to the front surface with the resist layer 111 preventing material from entering the gap 109 in the blind via 99. The resist layer 111 may then be removed.

Figure 13:
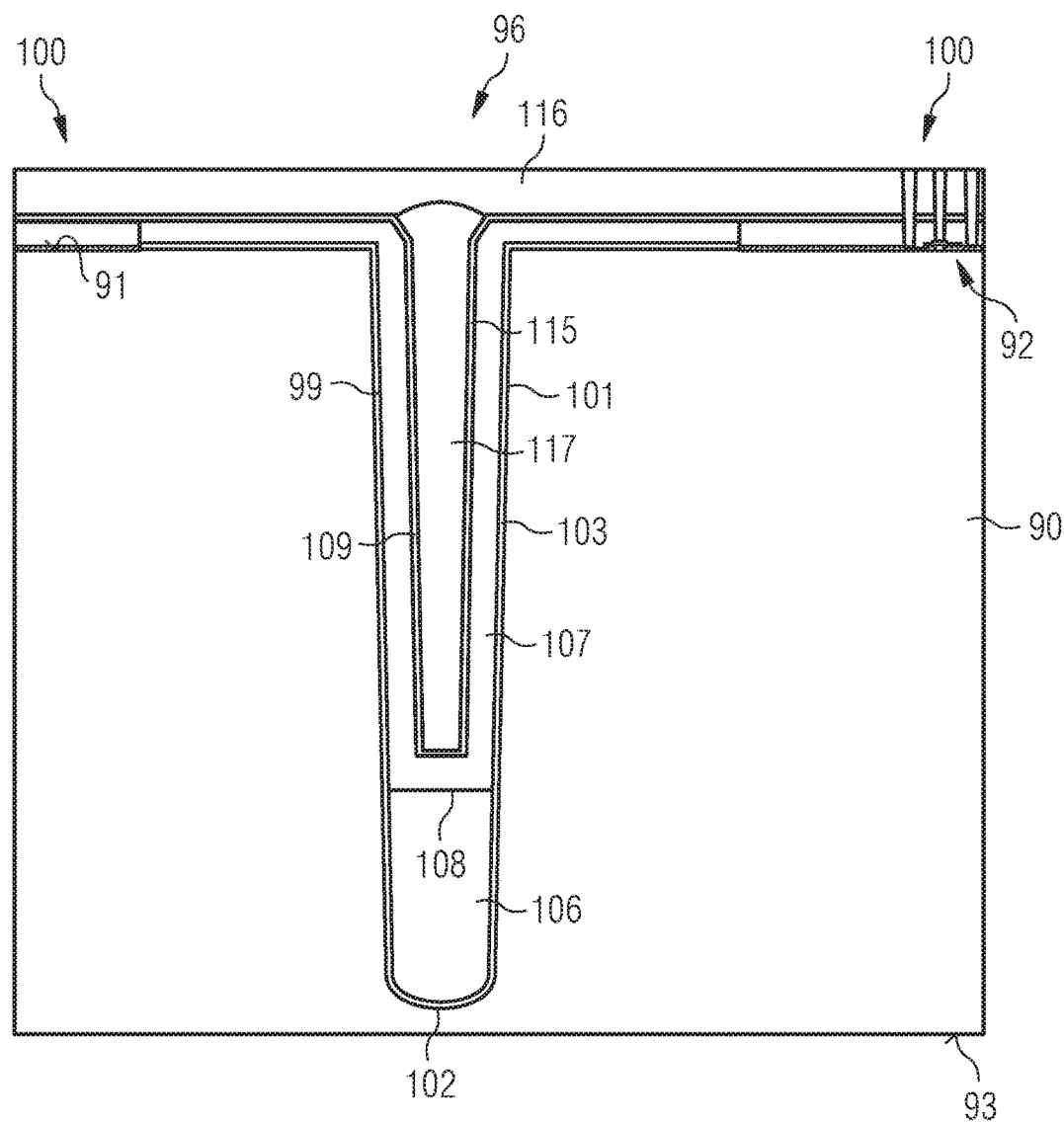
FIG. 13 illustrates a cross-sectional view of a cavity formed in the blind via above the conductive plug.

FIG. 13 illustrates a void or enclosed cavity formed within the upper portion 110 of the blind via 99. The void or enclosed cavity may be defined by dielectric material. The void may be formed by first depositing a silicon nitride layer 115 which lines the second conductive layer 107 within the blind via 99 and on the front surface 91. The silicon nitride layer 115 may be conformally deposited. A second dielectric layer such as an oxide 116 may be deposited onto the uppermost portion of the blind via 99 such that the oxide layer 116 seals the opening to the blind via 99 and forms a cavity or void 117 with the silicon nitride layer 115 within the blind via 99. The oxide layer 116 may also extend over the LDMOS transistor structure 91 and form an interlayer dielectric of a metallisation structure which is subsequently deposited on the front surface 91.

Figure 14:
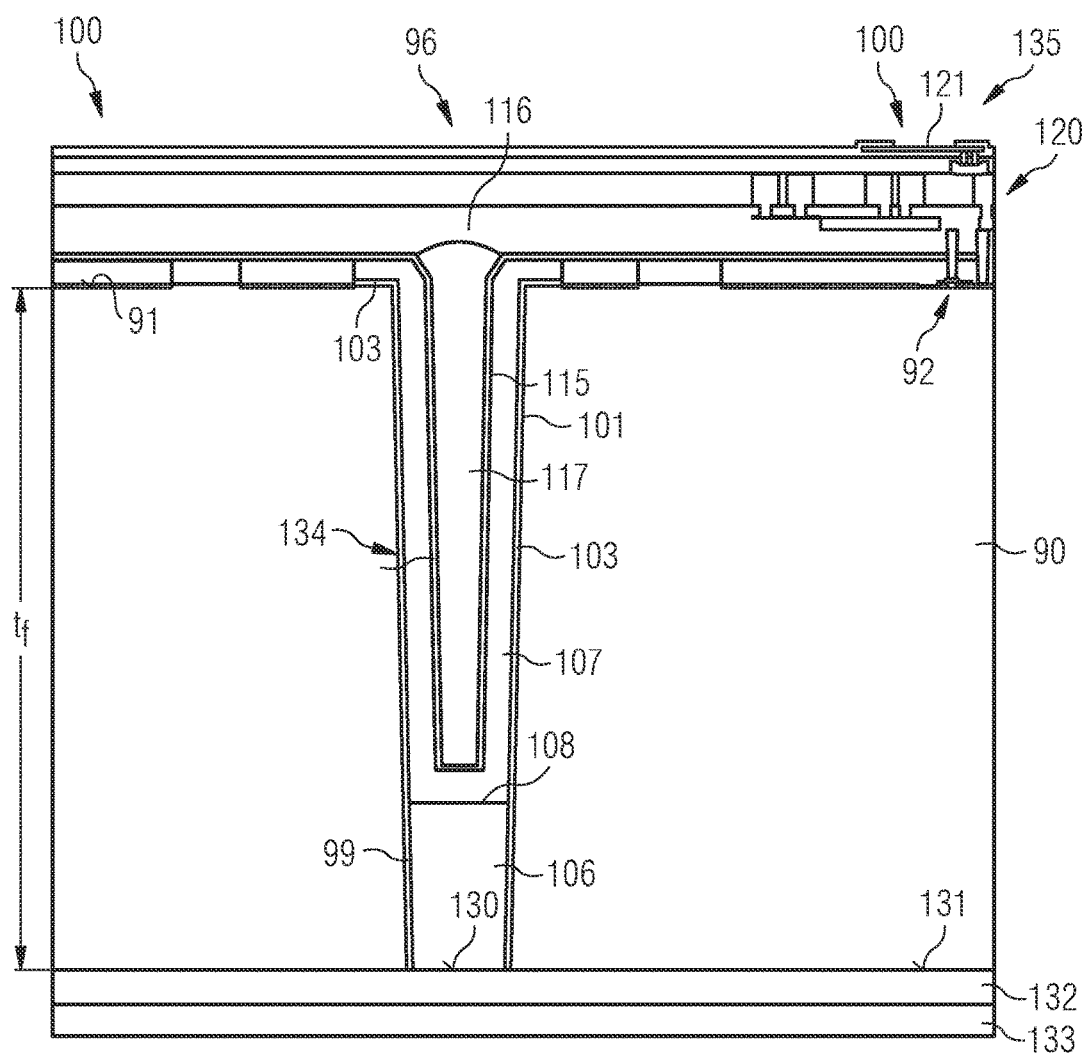
FIG. 14 illustrates a cross-sectional view of after formation of a metallization structure on the LDMOS transistor and after working of the rear surface to form a conductive through substrate via.

FIG. 14 illustrates an example of a metallisation structure 120 which may be formed on the front surface 91 to electrically couple the metal contacts of the LDMOS transistor structures 92 to contact pads 121. After the formation of the metallisation structure 120 on the front surface 91, the rear surface 92 of the initial substrate 90 may be worked to remove material, reduce the thickness of the semiconductor substrate 90 from the initial thickness $t_i$ to a final thickness $t_f$ and expose a surface 130 of the first conductive layer 106 at the base 102 of the blind via 99 such that the surface 130 is exposed in the new rear surface 131 of the semiconductor substrate 90. The rear surface may be worked by grinding.

One or more conductive layers 132 including a solder layer may be deposited onto the final surface 131 which enables the LDMOS transistor device to be mounted on, and electrically coupled to, a further surface such as a flange 133 which provides a ground plane for the LDMOS transistor device.

The combination of the first conductive layer 106 exposed in the rear surface 130 of the substrate 90 and the second conductive layer 109 which extends onto the front surface 91 and is electrically coupled with the LDMOS transistor structure 92 and, in particular, intrinsic source of the LDMOS transistor structure 92 provides a conductive through substrate via 134 for the LDMOS transistor device 135.

The conductive through substrate via 134 is partially filled since it includes a dielectric defined cavity 117 in its upper portion. The conductive through substrate via 134 includes a bottom closed metal plane provided by the first conductive layer 106 and a top plane which is partially formed by the dielectric layer 116 sealing the cavity 117. The closed metal plane at the bottom prevents contamination of the via during working of the rear surface 93 and the cavity 117 provides an expansion volume.

The semiconductor device including one or more LDMOS transistors according to any one of the embodiments described herein may be used in a high frequency power amplifying circuit, such as RF power amplifying circuits for use in cellular communications operating at frequencies in the range of 700 MHz to 3.6 GHz, power conversion in cellular communication networks and Doherty configuration amplifying circuits.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise it is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
   a semiconductor substrate;
   a LDMOS (Lateral Diffused Metal Oxide Semiconductor) transistor arranged in a front surface of the semiconductor substrate; and
   a conductive through substrate via,
   wherein the conductive through substrate via comprises:
   a via extending from the front surface to a rear surface of the semiconductor substrate;
   a conductive plug filling a first portion of the via, and
   a conductive liner layer lining side walls of a second portion of the via and electrically coupled to the conductive plug,
   wherein the through substrate via is formed between semiconductor sidewalls that vertically extend between the front and rear surfaces of the semiconductor substrate,
   wherein the conductive plug comprises an upper surface laterally extending between the semiconductor side- walls and a rear surface which is coplanar with the rear surface of the semiconductor substrate and opposite from the upper surface,
wherein vertical portions of the conductive liner layer vertically extend from the front surface to the upper surface of the conductive plug along the semiconductor sidewalls, and
wherein a lateral portion of the conductive liner laterally extends between the semiconductor sidewalls along the upper surface of the conductive plug.

2. The semiconductor device of claim 1, wherein the conductive liner layer is positioned directly on the conductive plug, forming an interface therebetween.

3. The semiconductor device of claim 1, wherein the conductive plug comprises a grain size that is larger than a grain size of the conductive liner layer.

4. The semiconductor device of claim 1, wherein the conductive liner layer surrounds a gap within the via.

5. The semiconductor device of claim 1, wherein the conductive through substrate via electrically couples an intrinsic source of the LDMOS transistor arranged in the front surface of the semiconductor substrate to a conductive layer arranged on a rear side of the semiconductor substrate.

6. The semiconductor device of claim 1, wherein the semiconductor substrate has a bulk resistivity $\rho > 100$ Ohm.cm.

7. The semiconductor device of claim 1, wherein the conductive through substrate via has a height $h_1$ and the conductive plug has a height $h_2$, wherein $h_2 \leq 2h_1/3$.

8. The semiconductor device of claim 7, wherein 20 $\mu m \leq h_1 \leq 100$ $\mu m$ and wherein 5 $\mu m \leq h_2 \leq 70$ $\mu m$.

9. The semiconductor device of claim 1, wherein the conductive liner layer has a thickness t, wherein $0.5$ $\mu m \leq t \leq 3$ $\mu m$, and the conductive plug has a height $h_2$, wherein 5 $\mu m \leq h_2 \leq 70$ $\mu m$.

10. The semiconductor device of claim 1, further comprising dielectric material covering the via and defining a cavity within the second portion of the via.

11. The semiconductor device of claim 10, wherein the dielectric material comprises a first layer arranged on the conductive liner layer and a second layer capping the via to define the cavity.

12. The semiconductor device of claim 11, wherein the first layer comprises $SiN_x$ and the second layer comprises $SiO_x$.

13. The semiconductor device of claim 1, wherein a plurality of conductive through substrate vias are arranged in a regular array.

14. The semiconductor device of claim 1, wherein a plurality of conductive through substrate vias are arranged in at least one row adjacent an elongate intrinsic source of the LDMOS transistor.

15. The semiconductor device of claim 1, wherein the conductive through substrate via is electrically coupled to an intrinsic source of two neighbouring transistor cells of the LDMOS transistor.

16. The semiconductor device of claim 1, wherein the conductive liner layer extends onto the first surface of the semiconductor substrate adjacent the via.

17. The semiconductor device of claim 16, further comprising a lateral conductive layer extending on the front surface of the semiconductor substrate between the conductive liner layer and an intrinsic source of the LDMOS transistor, wherein the conductive liner layer is arranged on a portion of the lateral conductive layer.

18. The semiconductor device of claim 17, wherein the lateral conductive layer and the conductive liner layer comprise different conductive materials.

19. The semiconductor device of claim 17, wherein the lateral conductive layer comprises Ti and the conductive liner layer comprises Cu.

20. The semiconductor device of claim 18, wherein the conductive liner layer has a thickness t and the lateral conductive layer has a thickness $t_1$, wherein $t/25 \leq t_1 \leq t/2$.

21. The semiconductor device of claim 1, wherein the conductive through substrate via further comprises a barrier layer structure in direct contact with the front surface of the semiconductor substrate in regions adjacent the via and further extending on and making direct contact with the semiconductor sidewalls, wherein the conductive plug and the conductive liner layer are arranged on the barrier layer structure.

* * * * *